United States Patent
Jakobs

(10) Patent No.: US 7,013,374 B2
(45) Date of Patent: Mar. 14, 2006

(54) INTEGRATED MEMORY AND METHOD FOR SETTING THE LATENCY IN THE INTEGRATED MEMORY

(75) Inventor: Andreas Jakobs, München (DE)

(73) Assignee: Infineon Technologies AG, Munich (DE)

( * ) Notice: Subject to any disclaimer, the term of this patent is extended or adjusted under 35 U.S.C. 154(b) by 326 days.

(21) Appl. No.: 10/649,408

(22) Filed: Aug. 27, 2003

(65) Prior Publication Data

US 2004/0047227 A1 Mar. 11, 2004

(30) Foreign Application Priority Data

Aug. 27, 2002 (DE) ............................ 102 39 322

(51) Int. Cl.
*G06F 12/00* (2006.01)
(52) U.S. Cl. .................................. 711/167
(58) Field of Classification Search ............. 711/167, 711/169; 365/230.08, 233
See application file for complete search history.

(56) References Cited

U.S. PATENT DOCUMENTS

| 5,544,124 A | * | 8/1996 | Zagar et al. ......... 365/230.08 |
|---|---|---|---|
| 5,655,105 A | * | 8/1997 | McLaury ................. 711/169 |
| 5,734,849 A | | 3/1998 | Butcher |
| 5,867,422 A | | 2/1999 | John |
| 6,154,415 A | * | 11/2000 | Jeong ...................... 365/233 |
| 6,226,724 B1 | | 5/2001 | Biggs |
| 6,804,165 B1 | * | 10/2004 | Schrogmeier et al. ..... 365/233 |
| 2002/0172085 A1 | | 11/2002 | Feurle |

FOREIGN PATENT DOCUMENTS

DE          101 24 278 A1    11/2002

* cited by examiner

*Primary Examiner*—Hiep T. Nguyen
(74) *Attorney, Agent, or Firm*—Laurence A. Greenberg; Werner H. Stemer; Ralph E. Locher

(57) ABSTRACT

An integrated memory has address inputs for applying a row address or a column address and a latency value, and an instruction decoder with a signal input. The instruction decoder uses a signal applied to the signal input to determine whether the address applied to the address inputs is the row address or the column address. If a column address is applied, an evaluation unit which is connected downstream of the instruction decoder and has evaluation inputs which are connected to the address inputs, is used to apply a latency signal corresponding to the latency value to an output of the evaluation unit.

10 Claims, 2 Drawing Sheets

| Latency | Address | | | | | ADD = row address when RAS = active |
|---|---|---|---|---|---|---|
| | ADD = latency value plus column address when CAS = active | | | | | |
| | Latency pins | | | | Address pins | Address pins |
| | A14 | ••• | A10 | A9 | A8-A1 | A14-A1 |
| Latency 1 | 0 | 0 | 0 | 1 | A8-A1 | X |
| Latency 2 | 0 | 0 | 1 | 0 | X | X |
| | | | | | X | X |
| Latency n | 1 | 1 | 1 | 1 | X | X |

FIG. 2 ll
INTEGRATED MEMORY AND METHOD FOR SETTING THE LATENCY IN THE INTEGRATED MEMORY

BACKGROUND OF THE INVENTION

Field of the Invention

The invention relates to an integrated memory having an adjustable latency and a method for setting the latency in the integrated memory. The invention can be used particularly in dynamic random access memories (DRAMs) and synchronous DRAMs (SDRAMs).

An integrated memory generally has a memory cell array that contains word lines and bit lines. In this case, the memory cells are disposed at the crossover points between the bit lines and word lines and are connected via a respective selection transistor, whose control input is connected to one of the word lines, to the bit line, via which a data signal is read or written. For memory access, a control circuit for controlling the memory access generally receives an access instruction in the form of a read instruction or a write instruction. To read or write a data signal, the respective selection transistor for the appropriate memory cell is turned on by an activated word line, as a result of which a data signal of a selected memory cell can subsequently be read or written.

In synchronous, that is to say clock-controlled, data communication, there is a certain time period, the "data latency", between the instruction that initiates the data transmission and the actual data transmission. If the memory chip in a computer system containing a processor and a memory chip receives a read instruction together with the desired address from the processor, then the memory chip subsequently sends the requested data to the processor. In this case, the data are not sent to the processor immediately, but rather a previously set fixed number of clock cycles later, the "CAS latency" (CL), also referred to as a read latency (RL). The same applies to the write operation. In this case, the processor sends the data to the memory chip delayed by a write latency (WL) after the write instruction.

Both the RL for the read instruction and the WL for the write instruction are permanently set in the mode register of the memory chip, usually when the system starts.

The magnitude of the RL and WL is dependent on the absolute time that the memory chip requires in order to provide the data and on the period duration of the system clock. The latency is defined as the ratio of the time period for providing the data to a clock period. That is to say that the latency, measured in clock cycles, becomes greater the higher the clock frequency becomes. If, for example, the memory chip requires 30 ns for a read operation and a system clock of 100 MHz is applied, which corresponds to a clock period of 10 ns, then a latency of 3 clock cycles is obtained. If, by contrast, a system clock 10 MHz is applied, which corresponds to a clock period of 100 ns, then a latency of 0.3 clock cycles is obtained.

In a large number of mobile applications, for example in the case of personal digital assistants (PDAs), the clock frequency is varied in order to save energy, because the energy consumed rises with the square of the clock frequency. In this case, however, the latency that is set always matches only a particular clock frequency. Normally, the latency is set to the highest occurring clock frequency in this context. If the clock frequency is lowered, the latency is unnecessarily long, which has a negative effect on the data throughput in the system. To change the latency, it is necessary to rewrite information to the mode register, but this takes a relatively large number of clock cycles.

An integrated memory is known in which the CAS latency is received together with the access instruction, that is to say the write or read instruction. To this end, the integrated memory contains a control circuit that is used to receive the CAS latency together with the access instruction. This solution has the drawback that transmitting the CAS latency requires additional signal inputs and hence additional pins on the memory.

SUMMARY OF THE INVENTION

It is accordingly an object of the invention to provide an integrated memory and a method for setting the latency in the integrated memory that overcome the above-mentioned disadvantages of the prior art devices and methods of this general type, in which setting the latency takes as little time as possible, that is to say is effected after as few clock cycles as possible.

With the foregoing and other objects in view there is provided, in accordance with the invention, an integrated memory. The integrated memory contains address inputs for receiving a latency value and a row address or a column address, an instruction decoder having a signal input and a signal applied to the signal input being used to determine whether an address applied to the address inputs is the row address or the column address, and an evaluation unit connected downstream of the instruction decoder and has evaluation inputs connected to the address inputs and an output. The evaluation unit produces a latency signal corresponding to the latency value after receiving the column address and the latency value. The latency signal is available at the output.

Advantageously, only a few external connections are required for the integrated memory.

The invention can be used to optimize data transmission in a synchronous system with a variable clock frequency such that all operations for data transmission can be executed with optimum latency, that is to say latency that is matched to the clock frequency. Losses as a result of repeated reprogramming of the mode register now have no basis.

The inventive integrated memory having address inputs for applying a row address or a column address and a latency value has an instruction decoder having a signal input and is in a form such that a signal applied to the address input can be used to determine whether the address applied to the address inputs is the row address or the column address. In addition, an evaluation unit which is connected downstream of the instruction decoder and has evaluation inputs which are connected to the address inputs is provided which is in a form such that if a column address is applied an output signal delayed by the latency value is produced at an output of the evaluation unit.

The inventive method for setting the latency in an integrated memory has the following steps. First, address inputs of the memory have a column address and a latency value applied to them. If a memory access instruction is applied, an evaluation unit is used to produce a latency signal on the basis of the latency value.

It is thus advantageous if the instruction decoder has an instruction input for applying an access instruction and is in a form such that, in the event of an access instruction being applied, it sends a control signal to the evaluation unit. The evaluation unit is additionally in a form such that it produces the latency signal when the control signal is applied.

In one embodiment of the invention, the evaluation inputs are connected to the address inputs that carry the most significant bits. This makes it a simple matter to render the memory compatible with conventional memory chips, because the pin assignment for the row and column addresses corresponds to the pin assignment hitherto in integrated memory chips.

In another embodiment of the invention, a second evaluation unit having second evaluation inputs and a second output is provided which is connected downstream of the instruction decoder. The second evaluation inputs are connected to the address inputs. The second evaluation unit is in a form such that if a column address is applied and the instruction decoder decodes a write instruction as an access instruction the latency value is produced at the output after having been converted into a write latency signal.

Advantageously, the evaluation unit has a data path connected downstream of it which is in a form such that it switches data from a memory array to output drivers on the basis of the latency prescribed by the evaluation unit.

It is also advantageous if the data path is in a form such that it switches data from input drivers to the memory array on the basis of the latency prescribed by the second evaluation unit.

In addition, an address buffer store can be connected between the address inputs and the evaluation inputs.

In another embodiment of the invention, an instruction buffer store can be connected between the instruction decoder and the evaluation units.

Other features which are considered as characteristic for the invention are set forth in the appended claims.

Although the invention is illustrated and described herein as embodied in an integrated memory and a method for setting the latency in the integrated memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a table showing the splitting of an address for addressing a memory array and for transmitting a latency value.

DESCRIPTION OF THE PREFERRED EMBODIMENTS

Figure 1:
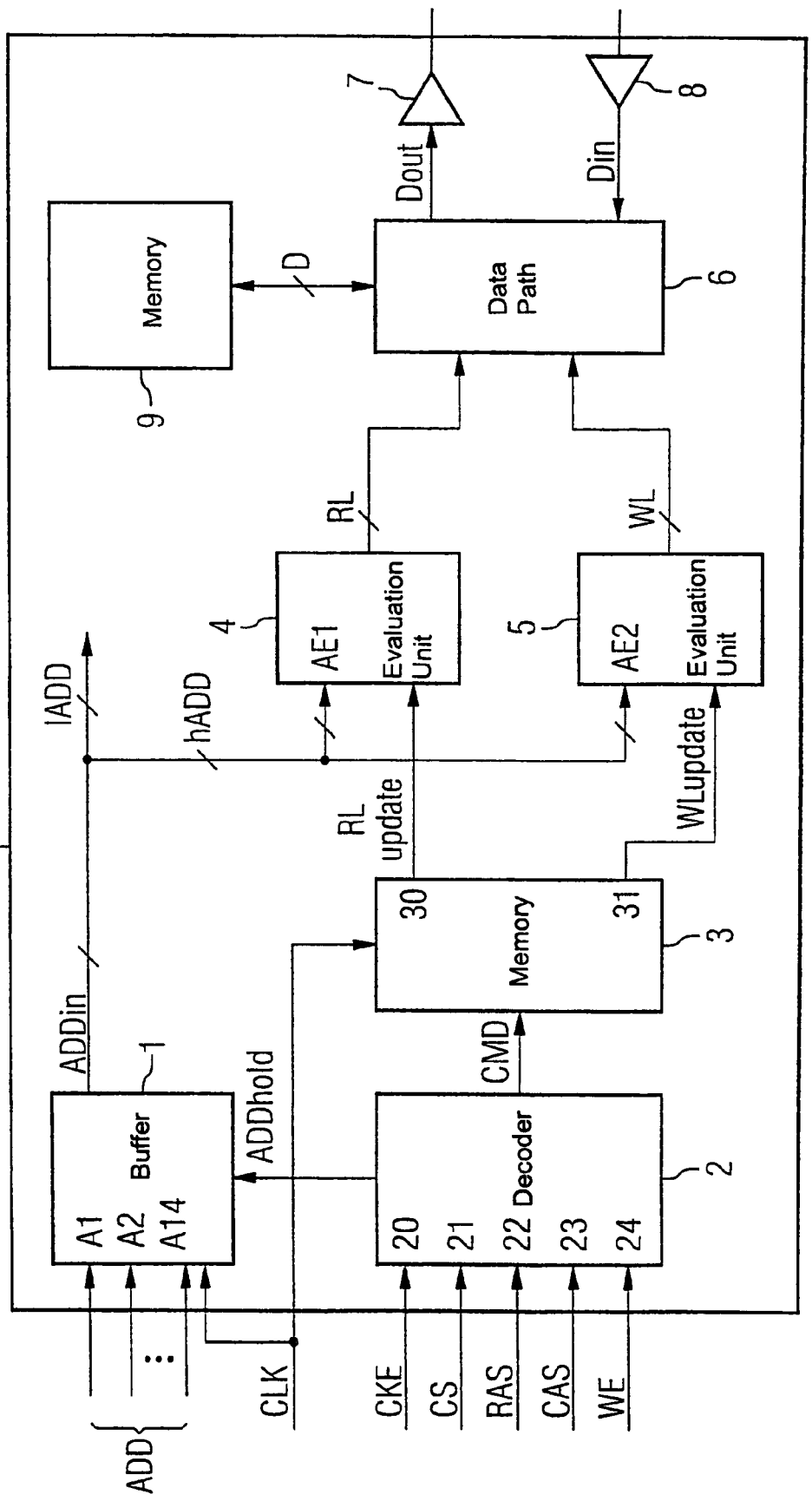
FIG. 1 is a block diagram of a basic design of an integrated memory in accordance with the invention.

The address for addressing a memory array is split, on the basis of a matrix-like organization of the memory array, into a row address for addressing a row of the memory array and a column address for addressing a column of the memory array. To keep down the number of address inputs in the integrated memory, the row address and the column address are applied to the address inputs of the memory not simultaneously but rather using a multiplexing method. A control signal is used to notify the memory chip of what type of address is involved, that is to say whether a row address or a column address is currently being applied to the address inputs.

If more address inputs or address lines are available than are required for addressing the columns in the memory array, the bits that are not used for addressing can be used elsewhere. An example will be used to explain this in more detail. In a 512 Mbit memory, 20 bits are required for transmitting the entire address. In this regard, 12 bits are transmitted as a row address and 8 bits are transmitted as a column address, but there are 14 address lines or address inputs available. Therefore, in transmitting the column address 6 bits can be used for other purposes. These are normally the most significant bits.

In the case of the inventive memory, these bits are used to transmit information about the desired or necessary latency. With an address bus having a width of 14 bits, it is possible to use, by way of example, the most significant 8 address bits when the column address is transmitted to transmit the latency. In this case, 64 different latencies can be prescribed. However, it is not absolutely essential for all 8 available address lines to be used to transmit the latency value. If 8 different latencies are sufficient, then just three address lines are required.

Referring now to the figures of the drawing in detail and first, particularly, to FIG. 1 thereof, there is shown one possible embodiment of an inventive integrated memory S in the form of a block diagram. Inputs A1, A2 . . . A14 of an address buffer 1 have an address ADD applied to them. The content of the address ADD is transferred to the buffer 1 with a clock signal CLK and an instruction ADDhold. The instruction ADDhold comes from an instruction decoder 2, which produces the instruction ADDhold and a read/write instruction CMD, also called a control instruction, from the signals CKE, CS, RAS, CAS, and WE applied to its inputs 20 to 24. In this case, the signal CKE is the clock enable, the signal CS is the chip select, the signal RAS is the row address strobe, the signal CAS is the column address strobe, and the signal WE is the write enable. The instruction decoder 2 identifies from the signals RAS and CAS applied to the inputs 22 and 23 whether the address ADD applied to the address inputs A1, A2 to A14 is a row address or a column address.

If the instruction decoder 2 uses the signals RAS/CAS to decode a column address and also the read instruction using the signal WE, then it forwards the read instruction to an instruction memory 3 as a read/write instruction CMD. A first output 30 of the instruction memory 3 then produces the instruction RLupdate. The effect of this is that an evaluation unit 4 connected downstream of the instruction memory 3 evaluates the more significant address bits hADD applied to its input AE1. The more significant address bit hADD are part of the address ADDin buffer-stored by the address buffer 1. In the case of a buffer-stored address ADDin having a length of 14 bits, for example, eight address bits 1ADD, which are the less significant address bits, are processed further using the logic units burst counter and row/data path in a known manner, and are therefore not described in more detail below. The remaining six more significant address bits hADD are supplied to the first evaluation unit 4, as mentioned. From these, the first evaluation unit 4 determines a read latency RL having a length of 2 bits, for example. The read latency RL is then present on a data path 6 and prompts data D coming from a memory cell array 9 to be routed to the output driver 7 synchronously as output data Dout after having been delayed by the read latency RL.

The latency value is thus transmitted together with the read instruction. In this case, the read latency RL is matched to the currently existing clock frequency CLK and can be transmitted either as an absolute latency or as a difference with respect to the latency currently set in the mode register.

If the instruction decoder 2 uses the signal WE to decode a write instruction and identifies that a column address is applied to the address inputs A1, A2 to A14, then as a read/write instruction CMD it produces a write instruction which is stored in the instruction memory 3 and is supplied as an instruction WLupdate to a second evaluation unit 5 via an output 31 of the instruction memory 3. The second evaluation unit 5 likewise has the more significant address bits hADD of the buffer-stored address ADDin applied to it. In a similar manner to the first evaluation unit 4, the second evaluation unit 5 evaluates the more significant address bits hADD and produces therefrom a write latency WL that is then applied to a further input of the data path 6. The data path 6 stores an input data Din coming from input drivers 8 in the memory cell array 9 as data D after they have been delayed by the write latency WL.

The latency value is transmitted together with the write instruction and the column address. In this case, the write latency WL can be matched to the currently existing clock frequency CLK. Both the desired absolute latency and the difference with respect to the latency currently set in the mode register can be transmitted.

FIG. 2 shows an example of the split of address pins in the form of a table. If the transmitted address ADD is made up of a latency value and a column address, as is the case when the signal CAS is active, the more significant address bits applied to the address pins A9, A10 to A14 are used for transmitting the latency value. In the table in FIG. 2, the address pins A9, A10 to A14 are called latency pins. The less significant address bits applied to the address pins A1 to A8 are used for transmitting the column address. In order to set a latency time 1, for example, the bit on latency pin A9 is set to the value 1, whereas the bits on latency pins A10 to A14 are set to the value 0.

If the signal RAS is active, the bits of the row address are applied to the address pins A1 to A14.

The invention is not limited to the use of an address bus having a width of 14 bits. This is intended to be used merely as an example for the purpose of better understanding of the invention.

I claim:

1. An integrated memory, comprising:
    address inputs for receiving a latency value and one of a row address and a column address;
    an instruction decoder having a signal input and a signal applied to said signal input being used to determine whether an address applied to said address inputs being the row address or the column address; and
    an evaluation unit connected downstream of said instruction decoder and having evaluation inputs connected to said address inputs and an output, said evaluation unit producing a latency signal corresponding to the latency value after receiving the column address and the latency value, the latency signal being available at said output.

2. The memory according to claim 1, wherein said instruction decoder has an instruction input for receiving an access instruction, said instruction decoder sending a control signal to said evaluation unit upon receiving the access instruction, and said evaluation unit producing the latency signal upon receiving the control signal.

3. The memory according to claim 1, wherein said evaluation inputs are connected to said address inputs carrying most significant address bits.

4. The memory according to claim 1, further comprising a further evaluation unit having further evaluation inputs and a further output, said further evaluation unit connected downstream of said instruction decoder and said further evaluation inputs are connected to said address inputs, said further evaluation unit upon receiving the column address and the latency value, in conjunction with said instruction decoder decoding a write instruction, produces a write latency signal available at said further output.

5. The memory according to claim 4, further comprising:
    a data path connected downstream of said evaluation unit;
    drivers, including input drivers and output drivers connected to said data path; and
    a memory array connected to said data path, said data path switches data from said memory array to said output drivers on a basis of the latency signal prescribed by said evaluation unit.

6. The memory according to claim 5, wherein said data path switches further data from said input drivers to said memory array on a basis of the write latency signal prescribed by said further evaluation unit.

7. The memory according to claim 4, further comprising an address buffer connected between said address inputs and said evaluation inputs and said further evaluation inputs.

8. The memory according to claim 4, further comprising an instruction buffer connected between said instruction decoder and each of said evaluation unit and said further evaluation unit.

9. A method for setting a latency in an integrated memory, which comprises the steps of:
    applying a column address and a latency value to address inputs of the integrated memory;
    carrying out a check to determine if the integrated memory has a memory access instruction applied to it; and
    using an evaluation unit to produce a latency signal on a basis of the latency value if the memory access instruction has been applied.

10. The method according to claim 9, which further comprises generating the memory access instruction if a read instruction or a write instruction is decoded.

* * * * *